(12) United States Patent
Jaarsma

(10) Patent No.: US 8,159,241 B1
(45) Date of Patent: Apr. 17, 2012

(54) METHOD AND APPARATUS FOR ON-CHIP ADJUSTMENT OF CHIP CHARACTERISTICS

(75) Inventor: Neal C. Jaarsma, Corvallis, OR (US)

(73) Assignee: Marvell International Ltd., Hamilton (BM)

( * ) Notice: Subject to any disclaimer, the term of this patent is extended or adjusted under 35 U.S.C. 154(b) by 844 days.

(21) Appl. No.: 12/107,466

(22) Filed: Apr. 22, 2008

Related U.S. Application Data

(60) Provisional application No. 60/913,633, filed on Apr. 24, 2007.

(51) Int. Cl.
*G01R 31/00* (2006.01)
(52) U.S. Cl. ......... 324/750.03; 324/762.01; 324/750.01; 324/750.14
(58) Field of Classification Search ............. 324/750.15, 324/750.3, 750.06, 750.14
See application file for complete search history.

(56) References Cited

U.S. PATENT DOCUMENTS

| | | | | |
|---|---|---|---|---|
| 4,095,165 | A * | 6/1978 | Boros | 323/283 |
| 6,668,346 | B1 | 12/2003 | Schulz et al. | |
| 6,853,177 | B2 * | 2/2005 | Shibayama et al. | 324/76.48 |
| 6,934,652 | B2 * | 8/2005 | Gauthier et al. | 702/99 |
| 7,348,857 | B1 * | 3/2008 | Ecker et al. | 331/44 |
| 7,605,662 | B2 * | 10/2009 | Kobayashi et al. | 331/11 |
| 2004/0108866 | A1 | 6/2004 | Burns et al. | |
| 2006/0186946 | A1 * | 8/2006 | Hughes | 327/427 |

OTHER PUBLICATIONS

*Extended Temperature Support for Cyclone Devices*, ALTERA White Paper, ver. 1.1, 2 pages, Jul. 2004.
Hamavand, Zaryab, *Analog Edge-Temperature Sensor Solutions for Low-Voltage Systems*, National Semiconductor, 3 pages, Jul. 28, 2005.
*How Do Dallas Semiconductor Delay Lines Work?*, Dallas Semiconductor MAXIM, 4 pages, Aug. 12, 2002.
*LM117/LM317A/LM317 3-Terminal Adjustable Regulator*, National Semiconductor, 26 pages, Jun. 2006.
*Tower Semiconductor adopts Legend's CharFlo-Memory!™ for quality assurance of commercially available memory compilers*, EDA Weekly, 2 pages, Jul. 28, 2005.

* cited by examiner

*Primary Examiner* — Richard Isla Rodas

(57) ABSTRACT

Systems and methods are provided for optimizing operation of an integrated circuit. In one implementation, a system is provided for optimizing operation of an integrated circuit by adjusting an operational parameter of the integrated circuit based on a reference count stored in non-volatile memory fabricated on the integrated circuit. In another implementation, a method is provided for optimizing operation of an integrated circuit by generating, during operation of the integrated circuit, a first oscillator count of an oscillator, comparing the first oscillator count with at least one reference count stored on the integrated circuit, and activating, a control circuit to adjust an operational parameter of the integrated circuit based on a result of the comparison.

8 Claims, 6 Drawing Sheets

STAGE I

FABRICATION OF INTEGRATED CIRCUIT(s)

STAGE II

FIELD IMPLEMENTATION OF INTEGRATED CIRCUIT(s)

METHOD AND APPARATUS FOR ON-CHIP ADJUSTMENT OF CHIP CHARACTERISTICS

RELATED APPLICATIONS

This application claims the benefit of priority to U.S. Provisional Application No. 60/913,633, filed on Apr. 24, 2007, titled "Method and Apparatus for On-Chip Performance Measurement of Temperature, Voltage, and Fabrication Process," which is herein incorporated by reference in its entirety.

TECHNICAL FIELD

Systems and methods disclosed herein relate to the field of integrated circuits (ICs) and, more specifically, to systems and methods of adjusting on-chip characteristics.

DESCRIPTION OF THE RELATED ART

Integrated circuits ("ICs") are widely used as building blocks for various electronic devices and electronic apparatus. Manufacturing of ICs is typically guided by operational requirements of the various electronic devices in which the ICs will be used. For example, fabrication testing may be performed to identify operating clock speeds of the ICs, and the ICs are rated accordingly. The tolerance levels of ICs may also be established during fabrication testing. These tolerance levels determine the effects of operating voltage and temperature on the operating clock speeds of the ICs. After determining the tolerance levels and rating the ICs in a controlled environment, the ICs may be installed in various electronic devices (referred to hereafter as "field implementation") where the ICs are expected to operate at their rated clock speeds during their entire lifetime.

To ensure that ICs in a field are operating at optimum levels while maintaining minimum necessary power consumption, there is a need to monitor the effects of operating voltage and temperature on the operating speeds of the ICs, and if necessary compensate for these effects. Another significant problem is the effect of temperature on leakage current and the impact of an increasing number of ICs that are idle during field implementation. One way of accounting for these variations is to use a reliable temperature detection mechanism which can trigger a control circuit to compensate for change in temperature and voltage. For example, on-chip thermal diodes may be used for temperature detection. However, thermal diodes are difficult to implement and require additional circuitry, thereby increasing circuit density and power consumption.

Processing tasks may be distributed between several ICs during field implementation. During processing of the tasks, electronic signals may propagate through the ICs and delays in the propagation of the electronic signals may increase with an increase in temperature, thus establishing a link between temperature and the propagation delay. To measure propagation delays and temperatures of the ICs during field implementation, oscillators may be fabricated on the ICs. An example of such an oscillator is a digital ring oscillator (DRO).

FIG. 1A illustrates a conventional DRO 100. The DRO may be fabricated on an IC and may consist of a feedback loop that includes an odd number of inverters 102a-k used to produce phase shifting that maintains oscillation. As the temperature of the IC changes, the frequency of DRO 100 will change. Accordingly, at any given temperature, the oscillator will exhibit a fixed oscillation frequency. This fixed oscillation frequency can be monitored by a counter to determine a related temperature value.

The relationship between the oscillation frequency and temperature of the IC is essentially linear, as is displayed in FIG. 1B. As oscillation frequency will vary with temperature, a count value generated by the counter will also vary proportionally to the oscillation frequency (150). A lookup table can be used to implement compensation measures in response to changes in temperature. However, the compensation measures are made relative to the present value generated by a DRO causing inaccurate adjustments, multiple iterations, and increased power consumption. Further, using lookup table causes a delay in compensation which may lead to continued power loss.

SUMMARY

In one embodiment consistent with the invention, a system for optimizing operation of an IC is provided. The system comprises an oscillator fabricated on the integrated circuit, the oscillator operating, during operation of the integrated circuit, at an oscillation frequency, a comparator to compare, during operation of the integrated circuit, at least one oscillator count based on the oscillation frequency with at least one reference count stored on the integrated circuit, and a control circuit to adjust an operational parameter of the integrated circuit, based on a result received from the comparator.

In certain embodiments, the system may also include an activation circuit for activating the control circuit based on the comparator result. The system may also include at least one voltage regulator adjusting the power supply of the integrated circuit, at least one fan adjusting the temperature of the integrated circuit, and at least one source clock adjusting a frequency of an input clock signal supplied to the integrated circuit.

In another embodiment consistent with the present invention, there is provided an IC comprising non-volatile memory, fabricated on the integrated circuit, and storing at least one reference count generated during fabrication of the integrated circuit, the at least one reference count being outputted, during operation of the integrated circuit, to a comparator, an oscillator, fabricated on the integrated circuit, the oscillator operating, during operation of the integrated circuit, at an oscillation frequency, and a counter, fabricated on the integrated circuit and outputting, to the comparator, at least one oscillator count based on the oscillation frequency, the comparator comparing the at least one reference count with the at least one oscillator count and comprising an activation circuit for activating a control circuit to adjust an operational parameter of the integrated circuit based on a result of the comparison.

In another embodiment consistent with the present invention, a method for optimizing operation of an IC is provided. The method comprises generating, during operation of the integrated circuit, a first oscillator count of an oscillator, comparing the first oscillator count with at least one reference count stored on the integrated circuit, and activating a control circuit to adjust an operational parameter of the integrated circuit based on the result of the comparison.

In certain embodiments, the method may also include generating, during operation of the integrated circuit, a second oscillator count, after adjusting the operational parameter, comparing the second oscillator count with the at least one reference count, adjusting the operational parameters of the integrated circuit, when the result indicates that the second oscillator count is less than or equal to the at least one reference count, and de-activating the control circuit when the result indicates that the second oscillator count is greater than the at least one reference count.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments. In the drawings.

DESCRIPTION OF THE EMBODIMENTS

In the following description, for purposes of explanation and not limitation, specific techniques and embodiments are set forth, such as particular sequences of steps, interfaces and configurations, in order to provide a thorough understanding of the techniques presented herein. While the techniques and embodiments will primarily be described in context with the accompanying drawings, the techniques and embodiments can also be practiced in other circuit types.

Reference will now be made in detail to the exemplary embodiments of the invention, examples of which are illustrated in the accompanying drawings. Wherever possible, the same reference numbers will be used throughout the drawings to refer to the same or like parts.

Figure 1A:
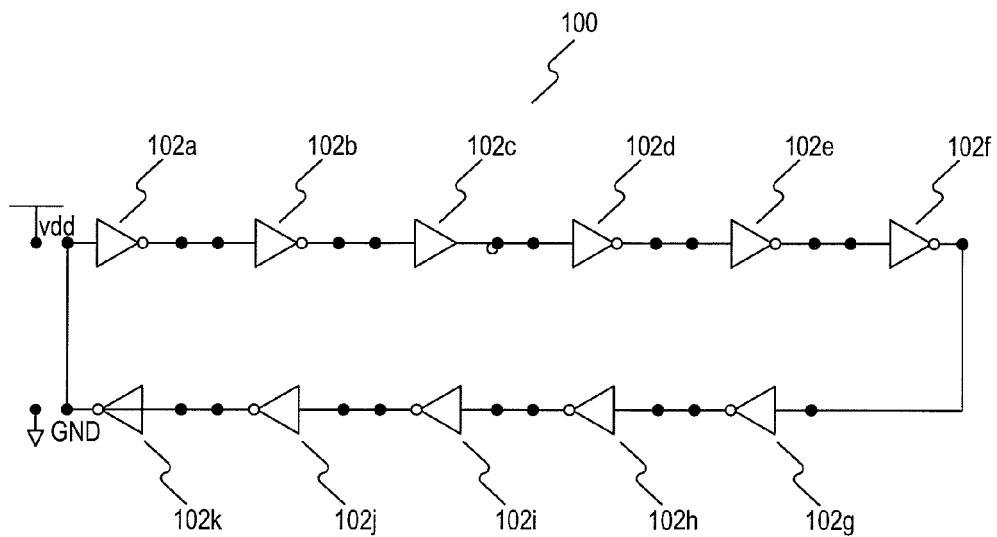
FIG. 1A is a schematic diagram of a conventional DRO.
Figure 1B:
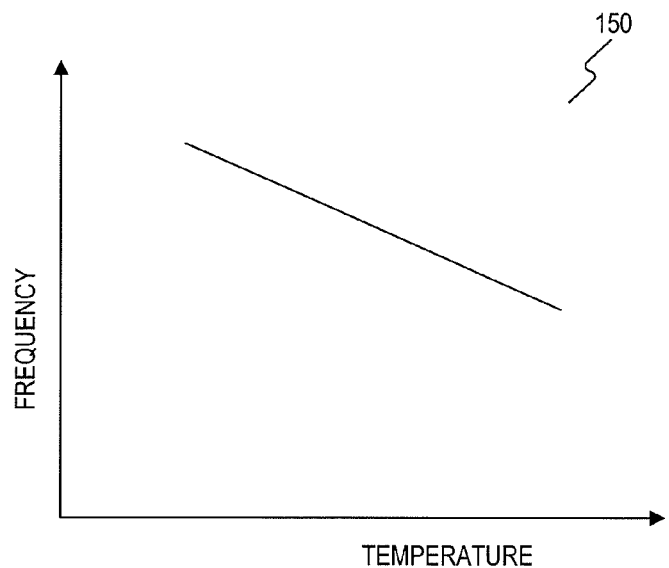
FIG. 1B illustrates the linear relationship between DRO frequencies of a conventional DRO fabricated on an IC, and temperatures of the IC.
Figure 2:
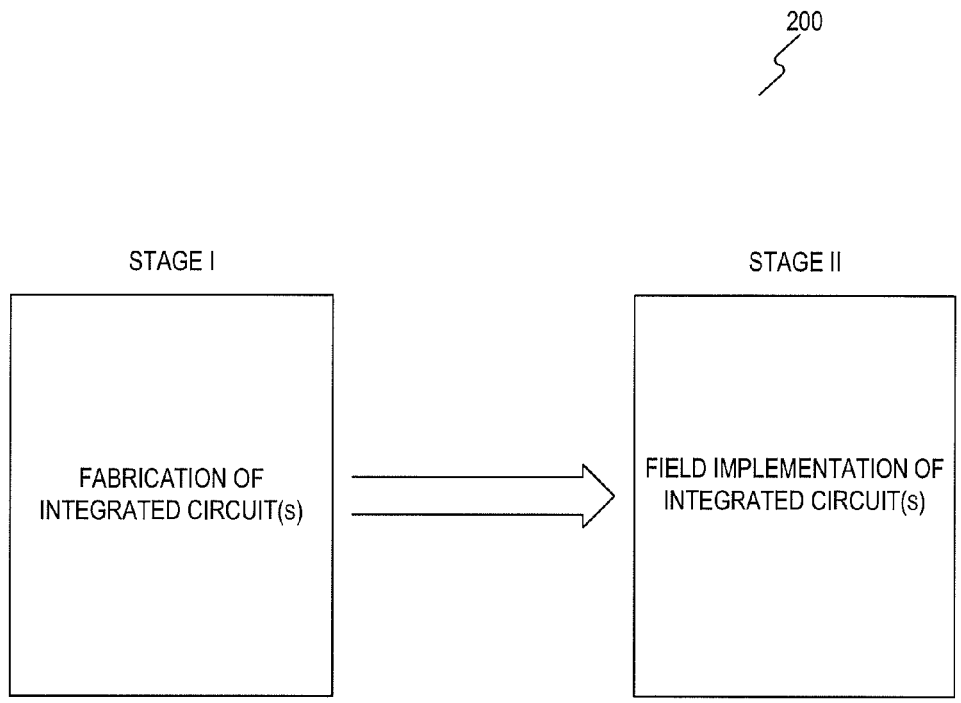
FIG. 2 is a schematic diagram illustrating implementation stages, consistent with one embodiment of the invention.

FIG. 2 illustrates implementation stages 200 for optimizing operations of ICs. Stage I may compromise fabrication of ICs. For example, various components including, oscillators, counters, and non-volatile memories, may be fabricated on ICs in stage I. During stage I, fabricated ICs may also undergo fabrication testing in a controlled environment. Fabrication testing may include determining rated speed, tolerance levels, operating points, and operational parameters of the ICs. The operating points may correspond to operational parameters which may indicate inputs required by the ICs to operate at a rated speed. For example, an operational parameter may indicate an operating voltage, temperature, and input clock required to operate an IC at a rated speed.

Effects of changes in temperature and operating voltage on performance of the ICs may also be assessed in stage I. Further, oscillators may be calibrated to determine reference counts and the reference counts may be programmed in the non-volatile memories. As is described in further detail below, the programmed reference counts may function as absolute values, measured in a controlled environment, for comparison with oscillator counts measured during operation of the ICs in stage II.

Stage II may compromise the field implementation of ICs. In stage II, the ICs fabricated in stage I may be implemented as components of various electronic devices and electronic apparatus. During field implementation, the ICs may be subject to varying conditions, including changes in temperature, operating voltage, clocking signals, and noise signals from other circuitry. To prevent any change in conditions from effecting performance of the ICs, operations of the ICs may be monitored using on-chip circuitry fabricated in stage I. Oscillator counts may be generated using counters and the generated oscillator counts may be compared with the programmed reference counts. Based on the comparison results, control circuits may be activated to compensate for the changes in conditions. As is described in further detail below, control circuits may adjust operational parameters of the ICs including, for example, input voltages, temperatures, clocking speeds, and power supply, to compensate for the effects of the change in conditions on the performance of the ICs. Stage II may be implemented using circuitry external or internal to the electronic devices and electronic apparatus in which the ICs may be implemented.

Figure 3:
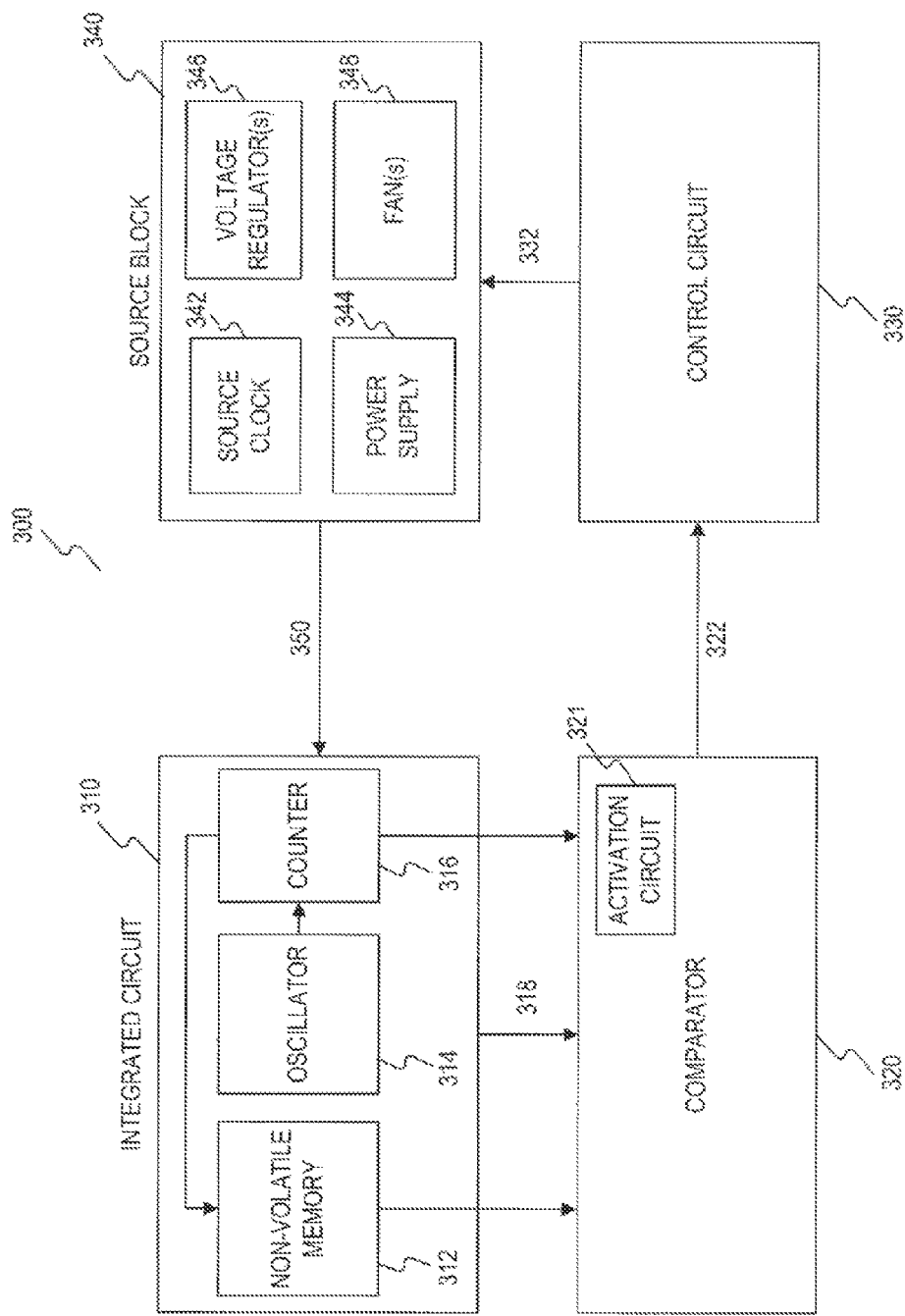
FIG. 3 is a schematic diagram illustrating a system for optimizing operation of an IC, consistent with one embodiment of the invention.

FIG. 3 illustrates a system 300 for optimizing operation of an IC 310. System 300 overcomes the aforementioned deficiencies of conventional systems. IC 310 may include non-volatile memory 312. Non-volatile memory 312 may include eFuse, EPROM, EEPROM, flash memory, OTP devices such as laser fuse or anti-fuse or any other medium which can be used to store the desired information. IC 310 may also include oscillator 314 and counter 316. Oscillator 314 may include a digital ring oscillator or any other oscillator which may have a consistent relationship between oscillation frequency and temperature. Counter 316 may be connected to oscillator 314 and may generate an oscillator count 318 corresponding to the oscillation frequency of oscillator 314. In general, IC 310 is an exemplary circuit and may include features and/or variations in addition to those set forth herein.

During fabrication testing, IC 310 may be rated and may be subjected to various conditions. Further, reference counts corresponding to the oscillation frequency of oscillator 314 may be generated by counter 316, and stored in non-volatile memory 312. Each reference count may reflect an oscillation frequency of oscillator 314 corresponding to an operational parameter of the IC. For example, a slowest operating point of IC 310 may have a corresponding temperature and power supply voltage. A reference count corresponding to the slowest operating point of IC 310 may be generated and stored in the non-volatile memory. Similarly, a reference count corresponding to a highest operating point of IC 310 or any other operating point of IC 310, may be generated and stored in non-volatile memory 312.

As shown in FIG. 3, IC 310 may be connected to source block 340. The arrangement of components in FIG. 3 is an exemplary arrangement, and further variations may be provided in addition to those set forth herein. For example, source block 340 may be fabricated on IC 310 and/or may also be connected to a plurality of ICs. Source block 340 may include a source clock 342 and a power supply 344 and may provide necessary operational inputs to IC 310. Source block 340 may control power supply 344 using voltage regulators 346 and may also regulate the temperature of IC 310 by using fans 348 to direct airflow toward IC 310.

IC 310 may also be connected to a comparator 320. Comparator 320 may be implemented as firmware, a combination of hardware and software, or as hardware alone. During operation of IC 310, comparator 320 may read oscillator count 318 generated by counter 310. Comparator 320 may also read the reference count stored in non-volatile memory 312 and may compare the oscillator count with the reference count. Based on the comparison, system 300 may activate control circuit 330. For example, when the oscillator count is less than, or equal to the reference count, comparator 320 may activate control circuit 330, using activation circuit 321 to generate a difference signal 322.

Control circuit 330 may be implemented to function as thermal management circuitry and may be connected to source block 340. Further, control circuit 330 may control an operational parameter of IC 310 using source block 340. Based on the difference between the reference count and the oscillator count, control circuit 330 may determine a course of action to compensate for the difference. For example, control circuit 322 may determine that the current operating temperature of IC 310 is high, and may then activate fans 348 in source block 340. Control circuit 330 may also increase or decrease the output of power supply 344 of IC 310 by using voltage regulators 346. Further, control circuit may increase or decrease clock speed of source clock 342. Control circuit 330 may thus dynamically adjust an operational parameter of IC 310, using one of the techniques described above, a combination of the techniques described above, or a combination of various conventional techniques.

After an operational parameter of IC 310 has been dynamically adjusted, counter 316 may generate a new oscillator count of IC 310, based on the oscillation frequency of oscillator 314. Comparator 320 may compare the new count with the reference count and if the new count is greater than the reference count, comparator 320 may deactivate controller 330, using activation circuit 321. When the new count is less than or equal to the reference count, comparator 320 may send a new difference signal 322 to control circuit 330. Control circuit 330 may further adjust an operational parameter of IC 310, using source block 340, to compensate for the new difference.

Figure 4:
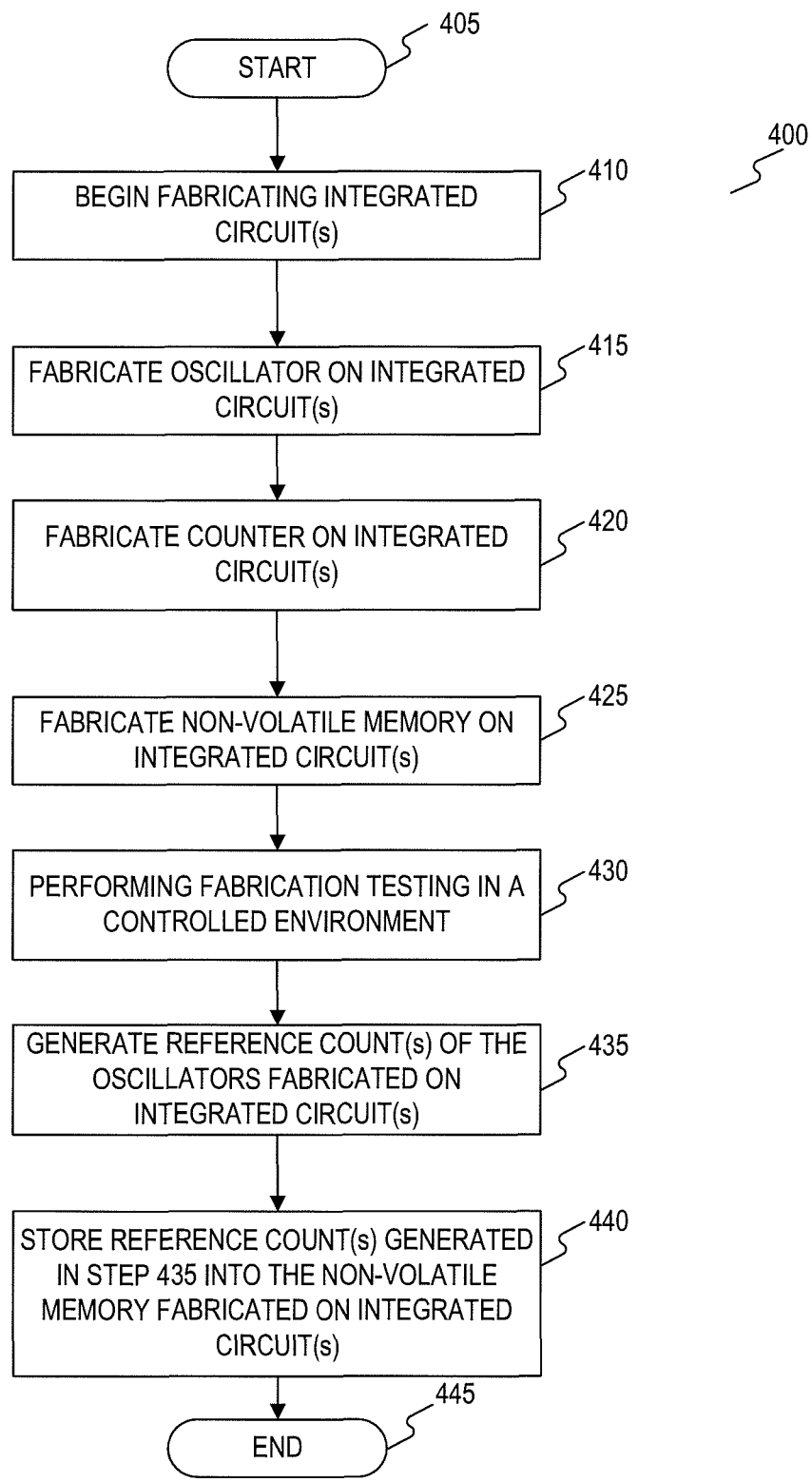
FIG. 4 shows a flow diagram of an exemplary method for fabricating an IC, consistent with one embodiment of the invention.

Referring now to FIG. 4, a method 400 for fabricating an IC, is provided. In step 410, fabrication of an IC, consistent with an embodiment of the invention may be started. In step 415, an oscillator may be fabricated on the IC. In steps 420 and 425, a counter and non-volatile memory may be fabricated on the IC, respectively. Once the various components are fabricated on the IC, the completed IC undergoes fabrication testing (step 430). In step 430, the operating clock speeds and the operating points of the IC may be determined, the IC may be rated, and the tolerance levels of the IC may be established. Further, the IC may be operated in a controlled environment to determine the effects various environments may have on the performance of the IC. For example, the temperature of the IC may be raised and a corresponding change in performance speed of the IC may be measured.

In step 435, reference counts reflecting oscillation frequency of the oscillator fabricated in step 415, may be generated. The reference counts may reflect an oscillation frequency of the oscillator, which may correspond to a certain operational temperature of the IC, a certain operational voltage of the IC, a certain operation clock speed of the IC, or a combination thereof. Next, in step 440, the reference counts generated in step 435 may be stored into the non-volatile memory fabricated in step 425. The programmed reference counts may function as absolute values for comparison with oscillator counts generated during the field implementation of the IC. The fabrication is completed at step 445.

Figure 5:
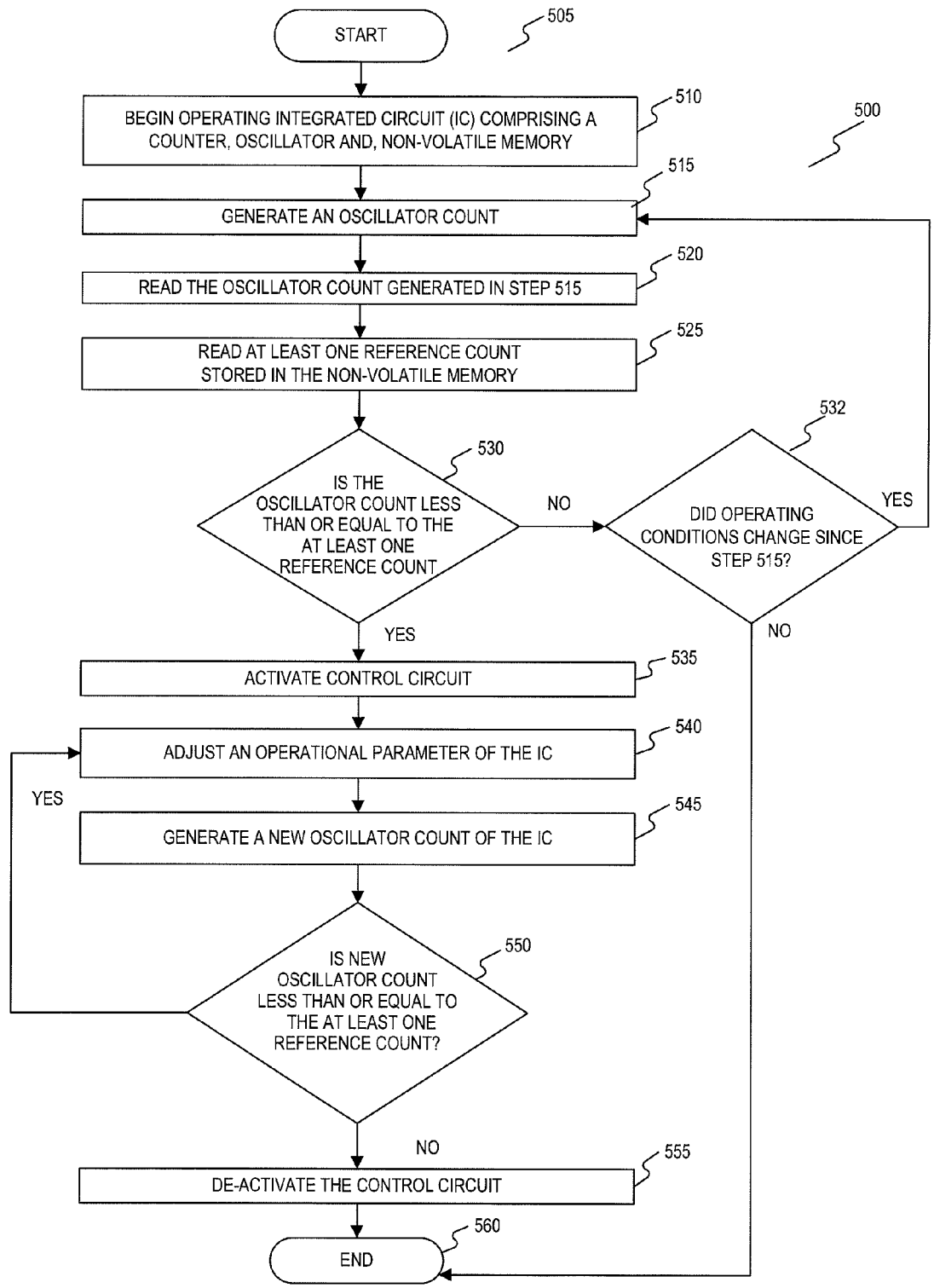
FIG. 5 shows a flow diagram of an exemplary method for optimizing operation of an IC, consistent with one embodiment of the invention.

FIG. 5 shows a flow diagram of a method 500 for optimizing operation of an IC, consistent with an embodiment of the invention. The method begins in step 510 where an IC comprising a counter, oscillator and non-volatile memory may begin operation. In step 515, an oscillator count reflecting the oscillation frequency of the oscillator may be generated using the counter. In steps 520 and 525, the generated oscillator count and one or more reference counts stored in the non-volatile memory may be read respectively. Next, in step 530, it may be determined if the oscillator count is less than or equal to the one or more of the reference counts. If the oscillator count is not less than or equal to the at least one reference count, the method may move to step 532, where it may be determined if the operating conditions of the IC have changed since step 515. If the operating conditions have not changed, the method determines that the IC is operating according to specifications of the IC and the method may end (step 560). If the operating conditions have changed, the method may move back to step 515, where a new oscillator count may be generated.

Returning now to step 530, when the oscillator count is determined to be less than or equal to one or more of the reference counts, the method may move to step 535. In step 535, a control circuit may be activated and a course of action may be determined to compensate for the difference between the reference count and the oscillator count. In step 540, the control circuit, activated in step 535, may dynamically adjust an operational parameter of the IC to compensate for the difference and optimize operation of the IC. For example, the control circuit may activate a fan to lower the operating temperature of the IC.

In step 545, a new oscillator count may be generated and in step 550, it may be determined if the new oscillator count is less than or equal to the one or more reference counts. If the new oscillator count of step 545 is determined to be less than or equal to the at least one reference count, the method may move back to step 540, where an operational parameter may be dynamically adjusted again. Based on the comparison, the method may move to step 555. For example, if the new oscillator count is not less than or equal to the reference count, the method may move to step 555, where the control circuit activated in step 535 may be deactivated. When the control circuit is deactivated, operation of the integrated circuit is optimized and the method ends (step 560).

Figure 6:
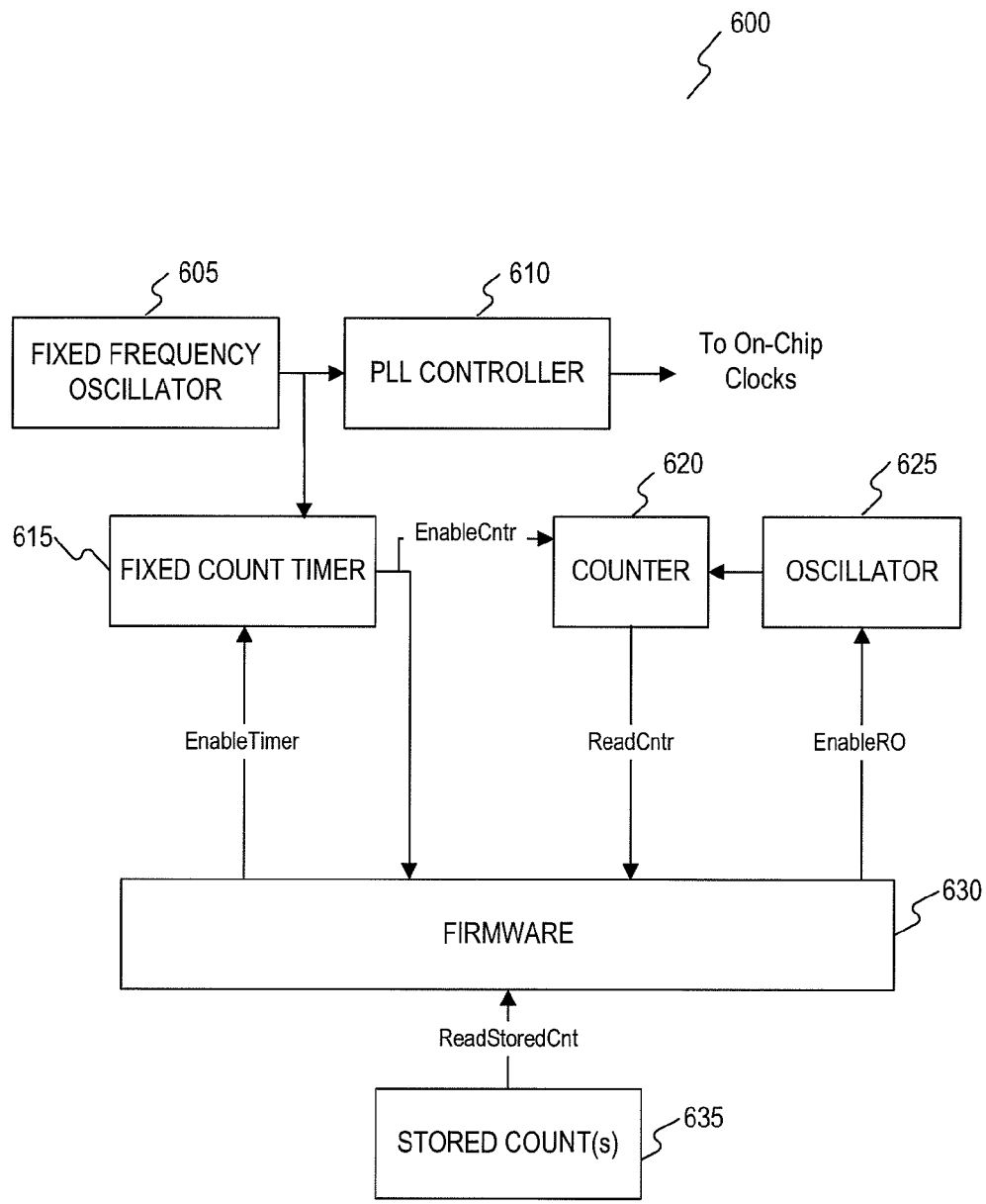
FIG. 6 is a schematic diagram illustrating a system for optimizing operation of an IC, consistent with one embodiment of the invention.

Referring now to FIG. 6, a schematic diagram, shows a system 600 for optimizing operation of ICs (not shown), is provided. With respect to FIG. 6, system 600 may include fixed frequency oscillator 605 that may provide a reference signal to a phased locked loop (PLL) controller 610 and to a fixed count timer 615. PLL controller 610, may provide a plurality of clock signals to a plurality ICs. The clock signals may have variable frequencies, depending on the rated speeds of the ICs. System 600 may also include fixed count timer 615. Fixed count timer 615 may be connected to a counter 620 and counter 620 may be connected to an oscillator 625.

Fixed count timer 615 may also be connected to firmware 630 and firmware 630 may be connected to oscillator 625 and to a non-volatile memory 635. Firmware 630 may perform a plurality of operations for optimizing operations of the ICs. For example, when PLL controller 610 provides the clock signals to the ICs, firmware 630 may simultaneously enable fixed count timer 615 and oscillator 625. Fixed count timer 615 may provide a reference signal to counter 620 and counter 620 may generate an oscillator count of at least one IC, based on the oscillation frequency of oscillator 625. The oscillation frequency of oscillator 625 may be affected by a change in temperature, voltage, and/or other operational parameters. Counter 620 may provide the generated oscillator count to firmware 630.

Firmware 630 may read a reference count from non-volatile memory 635, and may compare the reference count with the oscillator count. Based on the comparison, firmware 630 may adjust operating parameters of the ICs. For example, when the oscillator count is determined to be less than or equal to the reference count, firmware 630 may dynamically adjust the operational parameter of the IC, to compensate for the difference between the oscillator count and the reference count. Firmware 630 may change at least one of the power supply of the IC, the temperature of the IC, and the clock speed of the IC. It should be noted that multiple ICs may simultaneously be optimized by firmware 630. Optimization of operations of the ICs, during field implementation, may enable the ICs to operate in the fabrication process window and may decrease power consumption.

The foregoing description has been presented for purposes of illustration and is not exhaustive and does not limit the invention to the precise forms or embodiments disclosed. Modifications and adaptations of the various embodiments of the invention can be made. For example, one or more steps of methods described above may be performed in a different order or concurrently and still achieve desirable results.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus comprising:
   an integrated circuit, having fabricated thereon:
      an oscillator configured to oscillate at an oscillation frequency that is based on a temperature of the oscillator;
      a counter configured to count oscillations of the oscillator and to provide a counter output indicative of a number of oscillations of the oscillator during a count period;
      a comparator configured to compare the counter output with a stored reference count; and
      a control circuit configured to adjust an operational parameter of the integrated circuit based on a result received from the comparator, wherein the operational parameter includes at least one of a supply of power to the integrated circuit, an airflow to the integrated circuit, and a frequency of a clock signal provided to the integrated circuit;
   a voltage regulator configured to adjust the supply of power to the integrated circuit based on the result;
   a fan configured to adjust the airflow to the integrated circuit based on the result; and
   a clock circuit configured to provide the clock signal to the integrated circuit and to adjust the frequency of the clock signal based on the result.

2. The apparatus of claim 1, wherein a non-volatile memory is also fabricated on the integrated circuit and the non-volatile memory is configured to be programmed with the reference count during fabrication of the integrated circuit.

3. The apparatus of claim 1, wherein an activation circuit is also fabricated on the integrated circuit, and the activation circuit is configured to activate the control circuit based on an output of the comparator.

4. The apparatus of claim 3, wherein the activation circuit is further configured to activate the control circuit if the output of the comparator indicates that the number of oscillations of the oscillator during the count period is less than or equal to the stored reference count.

5. An integrated circuit comprising:
   non-volatile memory configured to store a reference count programmed during manufacturing of the integrated circuit and to provide the stored reference count to a comparator;
   an oscillator configured to oscillate at an oscillation frequency;
   a counter configured to count oscillations of the oscillator during a count period and to output a count signal indicative of the counted oscillations;
   the comparator, wherein the comparator is configured to provide a comparison output signal based on a comparison of the stored reference count with the counted oscillations; and
   an activation circuit configured to adjust an operational parameter of a control circuit of the integrated circuit based on a result of the comparison, wherein the operational parameter includes at least one of a supply of power to the integrated circuit, an airflow to the integrated circuit, and a frequency of a clock signal provided to the integrated circuit, and wherein the control circuit is configured to interface with:
      a voltage regulator configured to adjust the supply of power to the integrated circuit based on the result;
      a fan configured to adjust the airflow to the integrated circuit based on the result; and
      a clock circuit configured to provide the clock signal to the integrated circuit and to adjust the frequency of the clock signal based on the result.

6. The integrated circuit of claim 5, wherein the control circuit is configured to be activated if the comparison output signal indicates that the oscillations counted during the count period are less than or equal to a value of the stored reference count.

7. The integrated circuit of claim 5, wherein the stored oscillator count is generated during manufacturing test of the integrated circuit, the manufacturing test including operation of the integrated circuit in a controlled environment.

8. The integrated circuit of claim 5, wherein the oscillator is a digital ring oscillator.

* * * * *